United States Patent [19]
Pelley, III

[11] Patent Number: 5,303,190
[45] Date of Patent: Apr. 12, 1994

[54] STATIC RANDOM ACCESS MEMORY RESISTANT TO SOFT ERROR

[75] Inventor: Perry H. Pelley, III, Austin, Tex.

[73] Assignee: Motorola, Inc., Schaumburg, Ill.

[21] Appl. No.: 966,910

[22] Filed: Oct. 27, 1992

[51] Int. Cl.$^5$ ............................................. G11C 7/00
[52] U.S. Cl. .......................... 365/189.11; 307/296.3; 365/227; 365/228
[58] Field of Search ............... 307/296.1, 296.3, 296.6, 307/296.8; 365/226, 227, 228, 229, 189.11

[56] References Cited

U.S. PATENT DOCUMENTS

| | | | |
|---|---|---|---|
| 4,418,402 | 11/1983 | Heagerty et al. | 365/156 |
| 4,532,609 | 7/1985 | Iizuka | 365/154 |
| 4,590,508 | 5/1986 | Hirakawa et al. | 357/41 |
| 4,592,026 | 5/1986 | Matsukawa et al. | 365/203 |
| 4,725,981 | 2/1988 | Rutledge | 365/154 |
| 4,805,148 | 2/1989 | Diehl-Nagle et al. | 365/154 |
| 4,879,690 | 11/1989 | Anami et al. | 365/201 |
| 4,964,084 | 10/1990 | Jung et al. | 365/228 |
| 5,046,052 | 9/1991 | Miyaji et al. | 365/226 |
| 5,057,893 | 10/1991 | Sheng et al. | 357/41 |
| 5,103,113 | 4/1992 | Inui et al. | 365/226 X |
| 5,138,190 | 8/1992 | Yamazaki et al. | 307/296.5 |
| 5,189,641 | 2/1993 | Arakawa | 365/228 |

OTHER PUBLICATIONS

Barbara Chappell et al., "Stability and SER Analysis of Static RAM Cells", IEEE Transactions on Electron Devices, vol. ED-32, No. 2, Feb. 1985, pp. 465-470.
Paul M. Carter et al., "Influences on Soft Error Rates in Static RAM's", IEEE Journal of Solid-State Circuits, vol. SE-22, No. 3, Jun. 1987, pp. 431-432.

*Primary Examiner*—Eugene R. LaRoche
*Assistant Examiner*—Christopher R. Glembocki
*Attorney, Agent, or Firm*—Daniel D. Hill

[57] ABSTRACT

A static random access memory (30), resistant to soft error from alpha particle emissions has a high density array of memory cells (44) coupled to word lines (73 and 74) and bit line pairs (68), and operates at low power supply voltages (for example, 3.3 volts). A charging circuit (55) boosts a supply voltage to the memory array above the power supply voltage. The charging circuit (55) includes an oscillator (57), a charge pump (56), and a voltage regulator (58). The boosted supply voltage reduces the effect of an alpha particle hitting the memory array (44) at low power supply voltages. Providing a boosted supply voltage to the memory array (44) improves soft error resistance without adding capacitance to each memory cell (52 and 54).

19 Claims, 4 Drawing Sheets

FIG.2 —PRIOR ART—

STATIC RANDOM ACCESS MEMORY RESISTANT TO SOFT ERROR

FIELD OF THE INVENTION

This invention relates generally to static random access memories (SRAMs), and more particularly, to a SRAM resistant to soft error.

BACKGROUND OF THE INVENTION

FIG. 1 illustrates in schematic diagram form six-transistor memory cell 10 according to the prior art. Memory cell 10 includes N-channel transistors 11 and 12, P-channel transistors 13 and 14, and N-channel pass transistors 15 and 16. The gates of N-channel transistor 11 and P-channel transistor 13 are connected to node 102. The gates of N-channel transistor 12 and P-channel transistor 14 are connected to node 101. N-channel pass transistor 15 has a first current electrode connected to node 101 and a second current electrode connected to bit line 17 labeled "BL". N-channel pass transistor 16 has a first current electrode connected to node 102 and a second current electrode connected to bit line 18 labeled "BL*". (Note that an asterisk "*" after a signal or line name indicates that the signal or line is a logical complement of a signal or line having the same name but lacking the asterisk "*".) The gates of N-channel pass transistors 15 and 16 are connected to word line 19 labeled "WL". N-channel pass transistors 15 and 16 couple nodes 101 and 102, respectively, to bit lines 17 and 18 when word line 19 is enabled as a logic high. The sources of P-channel transistors 13 and 14 are connected to a positive power supply voltage terminal labeled "$V_{DD}$". The source of each of N-channel transistors 11 and 12 is connected to a negative power supply voltage terminal labeled "$V_{SS}$". $V_{SS}$ is normally at ground potential and $V_{DD}$ receives a power supply voltage of about 3.3 volts. A power supply voltage of about 3.3 volts may range between about 3.0 volts and about 3.6 volts.

N-channel transistors 11 and 12 and P-channel transistors 13 and 14 form a cross-coupled latch. Memory cell 10 stores a data bit based on the voltages at nodes 101 and 102. Reading and writing to memory cell 10 is accomplished through bit lines 17 and 18. To write data into memory cell 10, word line 19 is enabled as a logic high and complementary data signals are applied to bit lines 17 and 18 at a potential high enough to overwrite the contents of the memory cell. The voltage on bit lines 17 and 18 is approximately at the potential of $V_{DD}$ for a logic high and near $V_{SS}$ for a logic low. Memory cell 10 will latch in either a logic high or a logic low state depending on the logic states of bit lines 17 and 18.

Assuming bit line 17 is a logic high and bit line 18 is a logic low when word line 19 is enabled, N-channel pass transistors 15 and 16 are both conductive. The logic states of bit lines 17 and 18 are provided to nodes 101 and 102. Node 101 becomes a logic high, causing P-channel transistor 14 to become substantially non-conductive and N-channel transistor 12 to become conductive. Node 102 is reduced to a logic low voltage equal to approximately the negative power supply voltage. P-channel transistor 13 is conductive, and N-channel transistor 11 is non-conductive. Initially, a logic high voltage at node 101 is approximately equal to the positive power supply voltage minus a threshold voltage drop ($V_T$) across P-channel transistor 13. The voltage at node 101 will eventually rise to approximately the potential of $V_{DD}$. The $V_T$ across P-channel transistor 13 is equal to approximately 0.8 volts with a power supply voltage of 3.3 volts.

During a read cycle of memory 30, word line 19 is enabled, causing N-channel pass transistors to be conductive. Column logic/decoders select bit lines 17 and 18 to read the data bit stored in memory cell 10. The latched logic states stored on nodes 101 and 102 are provided to bit lines 17 and 18 as a relatively low differential voltage, (approximately 50-100 millivolts). During a read cycle, the logic states of nodes 101 and 102 remain unchanged.

Memory cell 10 maintains the current logic state for as long as a power supply voltage is provided. However, memory cell 10 may inadvertently change logic states due to charged particle emissions. These charged particles include alpha particles, x-rays, or other sources of ionizing radiation. Alpha particles are emitted as a result of the natural radioactive decay of radioactive elements such as uranium, americium, and thorium. Uranium and thorium are sometimes present in semiconductor packaging material in small amounts. Radioactive elements may also be present in the aluminum layers of the integrated circuit. The alpha particles are emitted from the radioactive elements and penetrate the memory array region of the SRAM cell. An alpha particle striking in the vicinity of memory cell 10 may change the logic state of the cell. When an alpha particle strikes the integrated circuit, electrons migrate toward the most positive sources. The charge from the alpha particle strike may be large enough to cause memory cell 10 to change logic states. This is called a soft error. A soft error is difficult to detect because the memory cell changes logic states without suffering any physical damage.

The critical charge ($Q_{CRIT}$) required to cause memory cell 10 to change logic states is equal to the product of the change in voltage as a result of the alpha particle hit ($\Delta V_a$), and the cell capacitance ($C_{CELL}$), or $$Q_{CRIT} = \Delta V_a C_{CELL} \tag{1}$$

Various techniques have been found to reduce soft error in memory cell 10. For instance, soft error is sometimes reduced by increasing cell capacitance $C_{CELL}$. Cell capacitance $C_{CELL}$ is increased by adding capacitance to N-channel transistors 11 and 12 of memory cell 10, or by coupling capacitors between each of nodes 101 and 102 and $V_{SS}$. $Q_{CRIT}$ should be made large enough to withstand the charge leakage caused by an alpha particle hit. However, write speed may be sacrificed if cell capacitance $C_{CELL}$ is too large. Increasing $Q_{CRIT}$ by adding capacitance increases the voltage change $\Delta V_a$ required to cause memory cell 10 to change logic states. But, adding capacitance to memory cell 10 increases process constraints and may increase the surface area required for each SRAM cell.

As the density and size of SRAMs are increased, memory cell sizes reduced, and power supply voltage decreased, memory cell 10 becomes even more vulnerable to soft error. Also, P-channel transistors 64 and 65 may be thin film transistor (TFT) loads. TFT transistors provide the advantages of low standby current and good cell stability without increasing cell size. However, the small size of a TFT transistor results in decreased cell capacitance, which also may cause increased soft error. Thus, in a very high density SRAM, as memory cell size is reduced, it becomes harder to increase cell capacitance $C_{CELL}$ without negating, at least in part, the reduction in size.

SUMMARY OF THE INVENTION

Accordingly, there is provided, in one form, a memory resistant to soft error. The memory comprises a plurality of memory cells, charging circuit means, and a diode. A power supply voltage terminal receives a power supply voltage at a first potential. The plurality of memory cells is coupled to word lines and bit line pairs, each memory cell for receiving data from, or providing data to the bit line pair to which it is coupled, when the word line to which it is coupled is enabled. The charging circuit means is coupled to the plurality of memory cells, and to the power supply voltage terminal. The charging circuit provides a boosted supply voltage to the plurality of memory cells at a second potential, the second potential higher than the first potential. The diode has a first terminal coupled to the power supply voltage terminal and a second terminal coupled to the plurality of memory cells. These and other features and advantages will be more clearly understood from the following detailed description taken in conjunction with the accompanying drawings.

DESCRIPTION OF A PREFERRED EMBODIMENT

Figure 1:
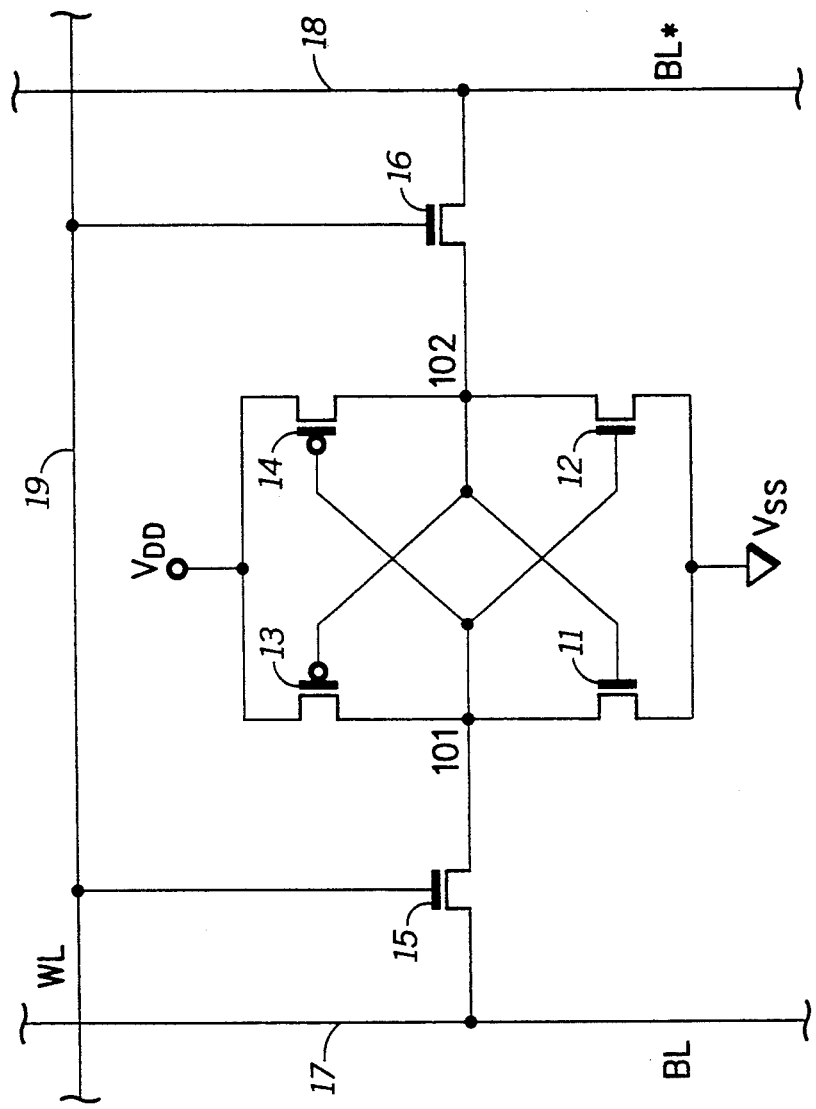
FIG. 1 illustrates in schematic diagram form a six-transistor SRAM cell according to the prior art.
Figure 2:
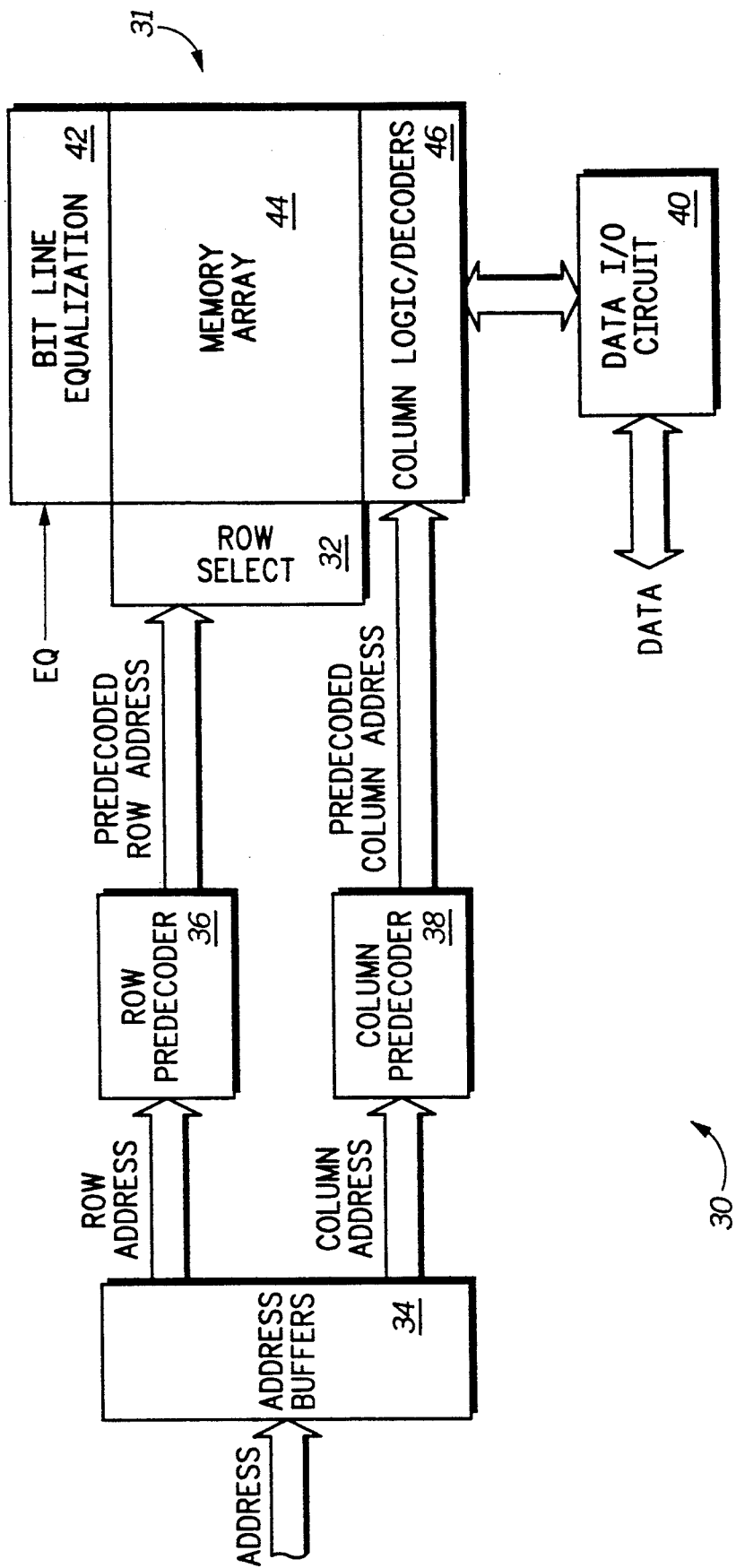
FIG. 2 illustrates in block diagram form a static random access memory in accordance with the prior art.

FIG. 2 illustrates in block diagram form a static random access memory 30 in accordance with the prior art. Memory 30 includes memory block 31, row select circuitry 32, address buffer 34, row predecoder 36, column predecoder 38, and data I/O circuit 40. Memory block 31 includes bit line equalization block 42, memory array 44, and column logic/decoder 46. Memory block 31 is a representative memory block of memory 30 and there may be other memory blocks present in memory 30. Memory cells in memory array 44 are located at intersections of word lines and bit line pairs.

Address buffer 34 receives an address signal labeled "ADDRESS", and provides a buffered differential row address labeled "ROW ADDRESS", and a buffered differential column address labeled "COLUMN ADDRESS". In applications where the memory array is further sub-divided into blocks, a block address may also be provided by address buffers 34 to block logic (not shown). For simplicity, only one memory block 31 is shown. In other embodiments, different numbers of blocks, different sizes of blocks and different word widths could be used. A bit line equalization signal labeled "EQ" is provided to bit line equalization block 42. Bit line equalization block 42 may provide precharge and equalization to the each bit line pair of memory array 31, thus decreasing the access time of memory 30.

Row predecoder 36 receives differential row address signals ROW ADDRESS, and in response, provides a plurality of predecoded row address signals labeled "PREDECODED ROW ADDRESS" to row select 32. Column predecoder 38 receives differential column address signals COLUMN ADDRESS, and in response provides a plurality of predecoded column address signals labeled "PREDECODED COLUMN ADDRESS" to column logic/decoder 46. The particular address signals received by row predecoder 36 and column predecoder 38 have no special significance and may be different in other embodiments. Also, the amount of decoding performed by the row and column predecoders may be different in other embodiments.

In a preferred embodiment, memory 30 operates with a power supply voltage of about 3.3 volts, and memory array 44 is a very high density memory array having a feature size of about 0.5 microns ($\mu$m) or less. Memory cells in memory array 44 are located at intersections of word lines and bit line pairs. Row select 32 receives a predecoded row address and in response, enables one of the word lines. All of the memory cells connected to the enabled word line are able to provide their contents to their respective bit line pairs. Each bit line pair serves as an input to the memory cells during the write cycle of memory 30 and as an output during the read cycle. Column logic/decoder 46 couples the bit line pairs to be read or written, to data I/O circuit 40. During a write cycle, data I/O circuit 40 receives a plurality of single-ended data signals labeled "DATA", and provides differential data signals to selected bit line pairs. During a read cycle, data I/O circuit 40 receives differential data signals from selected bit line pairs and provides a plurality of single-ended data signals DATA. For example, for a word width of X4, column logic/decoder 46 may couple 4 bit line pairs to data I/O circuit 40. Note, that in a preferred embodiment, memory 30 may be synchronous or asynchronous.

To read data from memory 30, row predecoder 36 receives a row address decoded from buffered differential row address signals ROW ADDRESS, and provides predecoded row address PREDECODED ROW ADDRESS to row select 32, to select a word line. Each memory cell of memory array 44 that is coupled to the selected word line provides its output as a differential voltage on a corresponding bit line pair. Predecoded column address signals PREDECODED COLUMN ADDRESS are provided to column logic/decoder 46. Column logic/decoder 46 is also coupled to each bit line pair. The number of data signals provided to, or received from memory 30 have no special significance and may be different in other embodiments. Column logic/decoder 46 senses and amplifies the relatively small differential voltage provided to the bit line pair, and couples the bit line pair to data input/output circuit 40. Data input/output circuit 40 receives a differential signal from column logic/decoder 46 corresponding to the differential signal from the bit line pair, and provides a single ended data signal DATA to a data output pad (not shown).

During a write cycle of memory 30, the flow of data is essentially reversed. Single-ended data signal DATA is provided to data I/O circuit 40. Column predecoder 38 provides predecoded column address PREDECODED COLUMN ADDRESS to column logic/decoder 46 which couples data I/O circuit 40 to a bit line pair. Row predecoder 36 provides predecoded row address PREDECODED ROW ADDRESS to row select 32 which selects a word line. As in the read cycle, memory cells located on an enabled word line provide data to bit line pairs. However, a voltage differential driven onto the bit line pairs by column logic/decoder 46 is greater than the drive voltage of the memory cell and overwrites a stored bit in the memory cell. At the end of a write cycle the differential voltage on the bit line pair must be reduced to a level small enough to prevent the data from being erroneously written into a memory cell during the following read cycle. Equalization of the bit line pairs is achieved by bit line equalization block 42.

Figure 3:
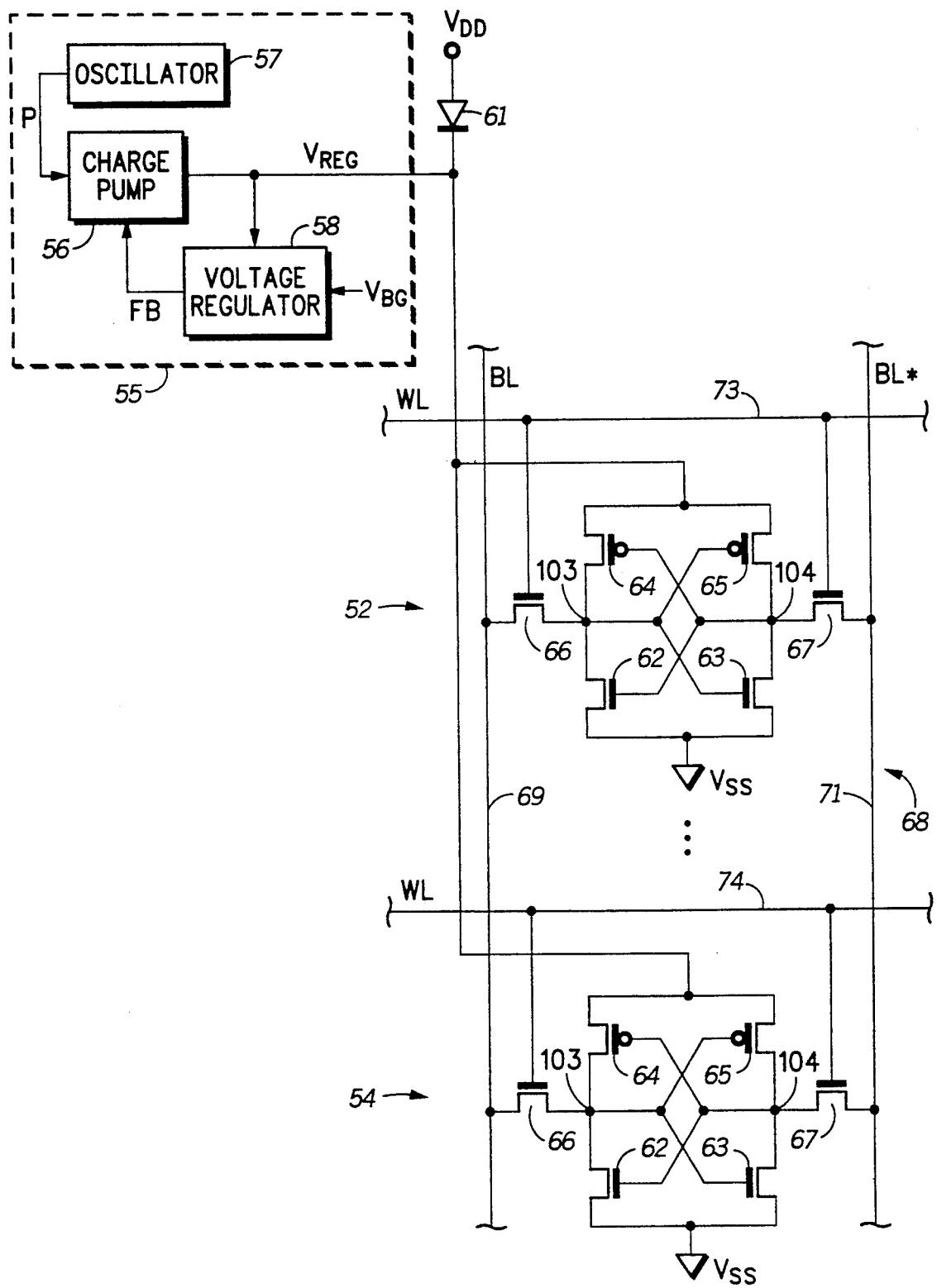
FIG. 3 illustrates in partial schematic diagram form and partial block diagram form a portion of the memory of FIG. 2 in accordance with one embodiment of the present invention.

FIG. 3 illustrates in partial schematic diagram form and partial block diagram form a portion of memory 30 of FIG. 2 in accordance with one embodiment of the present invention. A plurality of memory cells in memory array 44, represented by memory cells 52 and 54, are connected to bit line pair 68. Bit line pair 68 includes bit lines 69 and 71. Charging circuit 55, diode 61, and word lines 73 and 74 are also illustrated. Charging circuit 55 includes charge pump 56, oscillator 57, and voltage regulator 58.

Memory cells 52 and 54 are each six-transistor SRAM cells representative of the memory cells of memory array 44. Memory cells 52 and 54 each includes N-channel transistors 62 and 63, P-channel transistors 64 and 65, and N-channel pass transistors 66 and 67. (Note that like elements of memory cells 52 and 54 have been given the same reference numbers.) Memory cells 52 and 54 are high density memory cells designed to operate at low power supply voltages (approximately 3.3 volts). Therefore, it is important that the transistors of memory cells 52 and 54 have low leakage currents to reduce power consumption and to prevent unwanted voltage drops.

P-channel transistor 64 of memory cells 52 and 54 has a source for receiving a boosted supply voltage labeled "$V_{REG}$", a gate connected to node 104, and a drain connected to node 103. N-channel transistor 62 has a drain connected to the drain of P-channel transistor 64 at node 103, a gate connected to the gate of P-channel transistor 64 at node 104, and a source connected to a negative power supply voltage terminal labeled "$V_{SS}$". N-channel transistor 63 has a drain connected to the gate of P-channel transistor 64 at node 104, a gate connected to the drain of N-channel transistor 62 at node 103, and a source connected to $V_{SS}$. P-channel transistor 65 has a source connected to the source of P-channel transistor 64 for receiving boosted supply voltage $V_{REG}$, a gate connected to the drain of N-channel transistor 62, and a drain connected to the drain of N-channel transistor 63 at node 104.

N-channel pass transistors 66 and 67 of SRAM cell 52 each have a gate connected to word line 73 labeled "WL", and N-channel pass transistors 66 and 67 of SRAM cell 54 each have a gate connected to word line 74. N-channel pass transistor 66 of both SRAM cells 52 and 54 each have a first current electrode connected to bit line 69, and a second current electrode connected to node 103. N-channel pass transistor 67 of both SRAM cells 52 and 54 each have a first current electrode connected to bit line 71, and a second current electrode connected to node 104.

Diode 61 has a first terminal connected to a positive power supply terminal labeled "$V_{DD}$", and a second terminal connected to the sources of P-channel transistors 64 and 65 of both memory cells 52 and 54 of the plurality of memory cells. Charging circuit 55 provides boosted supply voltage $V_{REG}$ to the SRAM cells of memory array 44 of FIG. 2 as represented by memory cells 52 and 54. Charge pump circuit 56 is a conventional charge pump and is well known in the art. An example of a known charge pump circuit is taught in U.S. Pat. No. 5,138,190, entitled "Charge Pump Circuit". Oscillator 57 generates a series of pulses labeled "P", having a predetermined frequency. In a preferred embodiment, oscillator 57 is a conventional ring oscillator, and diode 61 is a relatively large Schottky diode. Diode 61 may also be a diode-connected transistor, where a first current electrode and a control electrode are coupled to $V_{DD}$, and a second current electrode is coupled to memory cells 52 and 54. Charge pump circuit 56 has a capacitor that is charged and discharged in response to oscillator pulse P. By charging and discharging the capacitor, charge pump circuit 56 can obtain voltages exceeding the positive power supply voltage. Voltage regulator 58 receives boosted supply voltage $V_{REG}$ from charge pump circuit 56 and a bandgap generated reference voltage labeled "$V_{BG}$". In response, voltage regulator 58 provides a feedback control signal labeled "FB" to control the pumping operation of charge pump 56. Voltage regulator 58 controls the pumping operation of charge pump 56 within an upper and a lower voltage range. When boosted supply voltage $V_{REG}$ reaches a predetermined upper limit, voltage regulator 58 provides feedback signal FB to disable charge pump 56. When voltage $V_{REG}$ drops to a predetermined lower limit, voltage regulator 58 provides feedback signal FB to start the pumping operation of charge pump 56. In a preferred embodiment, boosted supply voltage $V_{REG}$ varies about 100 millivolts (mV), having an upper limit of about 4.0 volts and a lower limit of about 3.9 volts.

During power up, memory array 44, including memory cells 52 and 54, receives a voltage equal to approximately the power supply voltage received at $V_{DD}$ minus a base-emitter diode voltage drop across diode 61. Charge pump 56 continues to increase the voltage to the predetermined upper limit. With an upper limit of about 4.0 volts, the logic high of nodes 103 and 104 will be equal to approximately 4.0 volts.

By keeping the supply voltage to memory array 44 above the power supply voltage, the voltage change due to an alpha particle "hit" $\Delta V_\alpha$ must be larger in order to induce a logic change in the SRAM cell. Referring back to equation (1), a larger supply voltage will increase the critical charge $Q_{CRIT}$ required to change the logic state. Hence, the possibility of soft errors due to alpha particle hits is reduced without greater process constraints caused by adding capacitance to the cell. Also, in a preferred embodiment, P-channel transistors 64 and 65 are thin film transistor (TFT) loads. TFT transistors provide the advantages of low standby current and good cell stability without increasing cell size. The small transistor size of the TFT transistors result in lower power consumption and higher operating speeds. However, the small size of the memory cell also results in decreased cell capacitance, which in turn may cause increased soft error rates (SER) at low power supply voltages. By boosting the supply voltage received by P-channel transistors 64 and 65, the benefits of a smaller memory cell can be realized without increased SER, or increased process complexity to add capacitance to the memory cell.

In the preferred embodiment, a conventional back bias generator (not shown) is used to provide a negative substrate bias. The negative substrate bias is more negative than ground, and improves the performance of the memory by increasing the threshold voltage ($V_T$) of transistors 62–65. An increased $V_T$ provides higher margins and also improves soft error resistance.

Figure 4:
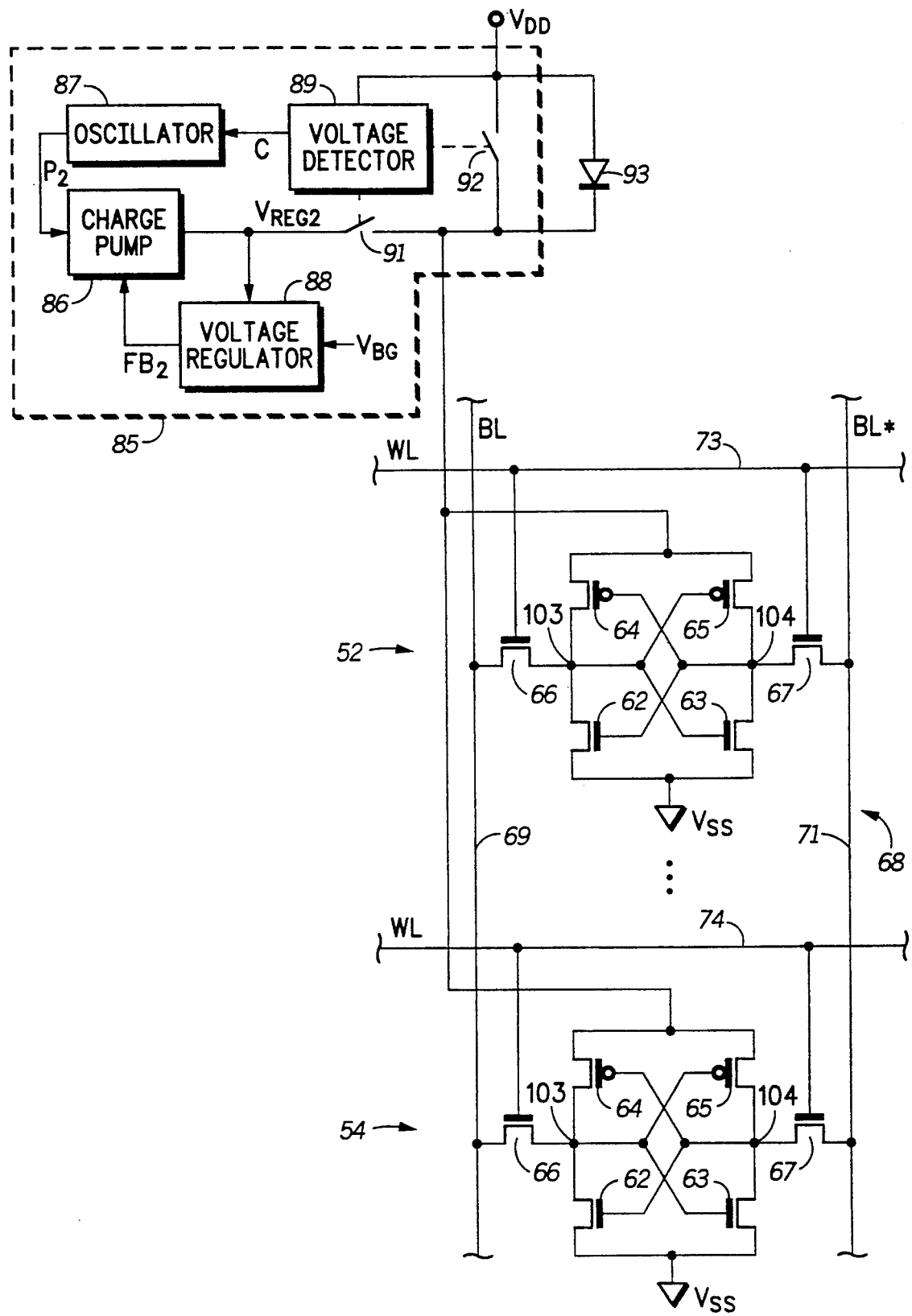
FIG. 4 illustrates in partial schematic diagram form and partial block diagram form a portion of the memory of FIG. 2 in accordance with another embodiment of the present invention.

FIG. 4 illustrates in partial schematic diagram form and partial block diagram form a portion of memory 30 of FIG. 2 in accordance with another embodiment of the present invention. A plurality of memory cells in memory array 44, represented by memory cells 52 and 54 are connected to bit line pair 68, and are the same as illustrated in FIG. 3. Bit line pair 68 includes bit lines 69 and 71. Charging circuit 85, diode 93, and word lines 73 and 74 are also illustrated in FIG. 4. Charging circuit 85 includes charge pump 86, oscillator 87, voltage regulator 88, voltage detector 89, and switches 91 and 92.

Charging circuit 85 provides boosted supply voltage $V_{REG2}$ to the SRAM cells of memory array 44 of FIG. 2 when memory 30 is operating in battery back-up mode or during a low voltage condition of the power supply. During battery back-up mode, or power-down mode of a memory, the power supply voltage is reduced to the lowest amount required to preserve the latched state of the memory cells. The voltage is reduced during battery backup mode to reduce power consumption. In battery back-up mode, or during a low voltage condition, the memory array, such as memory array 44, represented by memory cells 52 and 54, is more susceptible to soft error. When battery back-up mode is entered, charging circuit 85 detects the reduced power supply voltage and boosts the supply voltage to memory array 44. The boosted supply voltage helps to make memory array 44 more resistant to soft error during power down, or during a low voltage condition.

Charge pump circuit 86 is a conventional charge pump similar to charge pump 56 of FIG. 3. Oscillator 87 generates pulses labeled "P$_2$", having a predetermined frequency. In a preferred embodiment, oscillator 87 is a conventional ring oscillator. Voltage regulator 88 receives boosted supply voltage $V_{REG2}$ from charge pump circuit 86 and a bandgap voltage labeled "$V_{BG}$". In response, voltage regulator 88 provides a feedback control signal labeled "FB$_2$" to control the pumping operation of charge pump 86 upper and a lower voltage range. When voltage $V_{REG2}$ from charge pump 86 reaches the predetermined upper limit, voltage regulator 88 provides feedback signal FB$_2$ to disable charge pump 86. Also, voltage detector 89 provides a control signal labeled "C" to disable oscillator 87 at the same time charge pump 86 is disabled. Oscillator 89 is disabled in order to reduce the power consumption of charging circuit 85. When voltage $V_{REG2}$ drops to the predetermined lower limit, voltage regulator 88 provides feedback signal FB$_2$ to start the pumping operation of charge pump 86.

Diode 93 has a first terminal connected to $V_{DD}$, and a second terminal connected to the sources of P-channel transistors 64 and 65. Switch 91 has a first terminal for receiving voltage $V_{REG2}$, and a second terminal connected to the second terminal of diode 93. Switch 92 has a first terminal connected to $V_{DD}$, and a second terminal connected to the second terminal of diode 93. Voltage detector 89 receives power supply voltage $V_{DD}$, and contrtols the positions of switches 91 and 92. Switches 91 and 92 have two positions, open and closed. In the open position, switches 91 and 92 are substantially non-conductive, and prevent the flow of current between their first and second terminals. In the closed position, switches 91 and 92 are conductive and allow the flow of current between their first and second terminals.

Charging circuit 85 causes the supply voltage of memory array 44 to remain at voltage $V_{REG2}$ when memory 30 enters a battery backup mode or power-down mode of operation. In the embodiment of FIG. 4, charging circuit 85 would only provide voltage $V_{REG2}$ while in battery backup mode to keep the supply voltage to memory array 44 (FIG. 2) high enough to reduce the risk of soft error caused by alpha particle emissions. Voltage detector 89 determines when battery backup mode is entered by monitoring the power supply voltage $V_{DD}$. When battery backup is entered, voltage detector closes switch 91 and opens switch 92. At all other times, switch 92 is closed and switch 91 is open, causing the plurality of memory cells 52 and 54 of memory array 44 to be supplied by power supply voltage $V_{DD}$. In a preferred embodiment, switches 91 and 92 are MOSFETs (metal oxide semiconductor field effect transistors) having their gates controlled by voltage detector 89. Diode 93 helps to accelerate power up of the plurality of SRAM cells 52 and 54 when a power supply voltage is first applied and the memory is in battery backup mode.

While the invention has been described in the context of a preferred embodiment, it will be apparent to those skilled in the art that the present invention may be modified in numerous ways and may assume many embodiments other than that specifically set out and described above. For example, in other embodiments, the memory cells may be four-transistor cells where P-channel transistors 64 and 65 are replaced with resistors. Accordingly, it is intended by the appended claims to cover all modifications of the invention which fall within the true spirit and scope of the invention.

What is claimed is:

1. A static random access memory resistant to soft error, comprising:
    a plurality of static random access memory cells coupled to word lines and bit line pairs, each memory cell for receiving data from, or providing data to the bit line pair to which it is coupled, when the word line to which it is coupled is enabled;
    a power supply voltage terminal for receiving a power supply voltage at a first potential; and
    charging circuit means, coupled to said plurality of memory cells, and to said power supply voltage terminal, for providing a boosted supply voltage to said plurality of memory cells at a second potential, said second potential higher than said first potential, and said second potential is provided to said plurality of memory cells when said plurality of memory cells are both receiving said data and providing said data.

2. The memory of claim 1, wherein each memory cell of said plurality of static random access memory cells comprises a six-transistor static random access memory cell.

3. The memory of claim 1, wherein said charging circuit means comprises:
    oscillator means for producing a series of pulses at a predetermined frequency;
    charge pump means for receiving said series of pulses, and in response, for providing said boosted supply voltage; and voltage regulator means, coupled to said charge pump means, for receiving said boosted supply voltage, and for providing a feedback signal to said charge pump means for controlling said boosted supply voltage between predetermined upper and lower voltage limits.

4. The memory of claim 3, wherein said oscillator means comprises a ring oscillator.

5. The memory of claim 3, wherein said voltage regulator means comprises a bandgap controlled voltage regulator.

6. The memory of claim 1, wherein said diode comprises a diode-connected transistor.

7. The memory of claim 1, further comprising:
voltage detection means for detecting said first potential of said power supply voltage, and in response, providing a control signal when said first potential is less than or equal to a predetermined lower limit;
first switch means for coupling said charging circuit means to said plurality of memory cells, in response to said control signal; and
second switch means, coupled between said power supply voltage terminal and said plurality of memory cells, for decoupling said power supply voltage terminal from said plurality of memory cells in response to said control signal.

8. The memory of claim 7, wherein each of said first and second switch means comprises a MOSFET transistor.

9. A static random access memory having a write cycle and a read cycle, and having an array of static random access memory cells coupled to word lines and bit line pairs, comprising:
a power supply voltage terminal for receiving a power supply voltage having a first potential;
address means, coupled to said array of memory cells, for receiving an external address signal and in response selecting a word line and a bit line pair;
oscillator means for producing a series of pulses at a predetermined frequency;
charge pump means for receiving said series of pulses, and in response, providing a boosted supply voltage having a second potential greater than said first potential, said boosted supply voltage being provided to said array of memory cells during both of said read cycle and said write cycle;
voltage regulator means, coupled to said charge pump means, for receiving said boosted supply voltage, and providing a feedback signal to said charge pump means for controlling said boosted supply voltage between predetermined upper and lower voltage limits; and
a diode having a first terminal coupled to said power supply voltage terminal and a second terminal coupled to said array of memory cells.

10. The memory of claim 9, wherein each memory cell of said array of static random access memory cells comprises a six-transistor static random access memory cell.

11. The memory of claim 9, wherein said oscillator means comprises a ring oscillator.

12. The memory of claim 9, wherein said voltage regulator means comprises a bandgap controlled voltage regulator.

13. The memory of claim 9, wherein said diode comprises a diode-connected transistor.

14. The memory of claim 9, further comprising:
voltage detection means (89) for detecting first potential of said power supply voltage, and in response, providing a control signal when said first potential is less than or equal to a predetermined lower limit;
first switch means (91) for coupling said charging circuit means to said plurality of memory cells, in response to said control signal; and
second switch means (92), coupled between said power supply voltage terminal and said plurality of memory cells, for decoupling said power supply voltage terminal from said plurality of memory cells in response to said control signal.

15. The memory of claim 14, wherein each of said first and second switch means comprises MOSFET transistor.

16. A low voltage, high density static random access memory resistant to soft error, comprising:
an array of memory cells coupled to word lines and bit line pairs;
a power supply voltage terminal for receiving a power supply voltage at a first potential;
an oscillator for producing a series of pulses at a predetermined frequency;
a charge pump for receiving said series of pulses, and in response, providing a boosted supply voltage having a second potential greater than said first potential;
a voltage regulator, coupled to said charge pump, for receiving said boosted supply voltage, and providing a feedback signal to said charge pump for controlling said boosted supply voltage between predetermined upper and lower voltage limits;
a diode having a first terminal coupled to said power supply voltage terminal and a second terminal coupled to said array of memory cells;
voltage detection means for detecting said first potential of said power supply voltage, and in response, providing a control signal when said first potential is less than or equal to a predetermined lower limit;
first switch means for coupling said boosted supply voltage of said charging circuit means to said array of memory cells, in response to said control signal; and
second switch means, coupled between said power supply voltage terminal and said array of memory cells, for decoupling said power supply voltage terminal from said plurality of memory cells in response to said control signal.

17. The memory of claim 16, wherein said oscillator comprises a ring oscillator.

18. The memory of claim 16, wherein said voltage regulator comprises a bandgap controlled voltage regulator.

19. The memory of claim 16, wherein said diode comprises a diode-connected transistor.

* * * * *